US008817550B1

(12) United States Patent
Oh

(10) Patent No.: US 8,817,550 B1
(45) Date of Patent: Aug. 26, 2014

(54) SYSTEMS AND METHODS OF SEMICONDUCTOR MEMORY DEVICES INCLUDING FEATURES OF OUTPUT BUFFER INITIALIZATION CIRCUIT(S) AND/OR MULTIPLE POWER-UP DETECTION/HANDLING

(75) Inventor: Young-Nam Oh, San Jose, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 315 days.

(21) Appl. No.: 13/310,637

(22) Filed: Dec. 2, 2011

(51) Int. Cl.
*G11C 7/10* (2006.01)
*G11C 7/00* (2006.01)

(52) U.S. Cl.
USPC .................................. 365/189.05; 365/189.11

(58) Field of Classification Search
CPC ............... G11C 5/148; G11C 14/0054; G11C 2211/5642; G11C 7/1039; G11C 7/1051; G11C 7/106; G11C 7/1078; G11C 7/1087
USPC ........................................ 365/189.05, 189.11
See application file for complete search history.

(56) References Cited

U.S. PATENT DOCUMENTS

| 7,106,123 | B2 | 9/2006 | Kanno et al. |
| 7,656,718 | B2 | 2/2010 | Jeong |
| 2002/0180483 | A1* | 12/2002 | Lim et al. ........................ 326/83 |
| 2003/0117875 | A1* | 6/2003 | Lee et al. ....................... 365/226 |
| 2007/0008787 | A1* | 1/2007 | Oh et al. ................... 365/189.05 |
| 2007/0229137 | A1* | 10/2007 | Nishimura .................... 327/333 |
| 2007/0236249 | A1* | 10/2007 | Wong ............................. 326/37 |
| 2009/0237130 | A1* | 9/2009 | Sohn ............................ 327/143 |

\* cited by examiner

*Primary Examiner* — Vanthu Nguyen
*Assistant Examiner* — Khamdan Alrobaie
(74) *Attorney, Agent, or Firm* — DLA Piper LLP (US)

(57) ABSTRACT

Systems and methods are disclosed involving adaptive power up features for high-speed synchronous RAM. In one exemplary implementation, there is provided a semiconductor device including a memory cell, power circuitry, and an output buffer with level shifting circuitry. Moreover, the device may include power circuitry comprised of a first power up circuit and a second power up circuit and/or level shifting circuitry comprised of a pull up level shift circuit and a pull down level shift circuit. Other implementations and specific circuit configurations are also disclosed.

47 Claims, 15 Drawing Sheets

SYSTEMS AND METHODS OF SEMICONDUCTOR MEMORY DEVICES INCLUDING FEATURES OF OUTPUT BUFFER INITIALIZATION CIRCUIT(S) AND/OR MULTIPLE POWER-UP DETECTION/HANDLING

BACKGROUND

1. Field

The present innovations relate generally to high-speed synchronous SRAM and RLDRAM applications, and, more specifically, to systems and methods having power up aspects such as adaptive power up features.

2. Description of Related Information

Output buffer initialization techniques are commonly used to prevent leaked current during random power up sequences for high-speed synchronous SRAM and RLDRAM applications. Furthermore, various kinds of output buffer initialization schemes are implemented in attempt to achieve better performance and/or high speed operation.

In general, existing output buffers 100 (or "DQ" buffers), such as shown in FIG. 1, provide output buffer initialization in a typical memory circuit in order to read out Memory Core 105 data of Peripheral Circuit(s) 105 after completing power up sequences. Here, given two or more power supply voltages (e.g., VDD, VDDQ) associated with such output buffer circuitry, the power up sequence may often occur in an undesired sequence, even though a specified order may be shown in a relevant data sheet. For example, in existing circuitry, a second power supply voltage VDDQ may be powered up before a first power supply voltage VDD. FIGS. 2 and 3 illustrate such a circuit 200 (e.g., powered by VDD and VDDQ) and an illustrative timing diagram with internal signals PUB, PD, PU, PDB and output DQi, showing aspects of certain power up sequences occurring out of order, such as may occur at initialization. As seen in FIG. 3, as a result of power up of VDDQ prior to VDD, internal signals (e.g. PU) may be brought into undesired states (here, high) and/or VDDQ may otherwise be leaked-through, such that the output DQi also achieves an undesired state (again, high here in FIG. 3, i.e., until VDD is then powered on).

As set forth below, one or more aspects of the present inventions may overcome these or other drawbacks and/or otherwise impart innovative features.

DESCRIPTION OF THE DRAWINGS

The accompanying drawings, which constitute a part of this specification, illustrate various implementations and aspects of the present invention and, together with the description, explain various features of the innovations herein. In the drawings.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present inventions. Wherever possible, the same reference numbers will be used throughout the drawings to refer to the same or like parts.

Systems and methods consistent with aspects of the inventions herein provide desired power output states for any disorderly power up and/or initialization sequences between power supplies.

Figure 1:
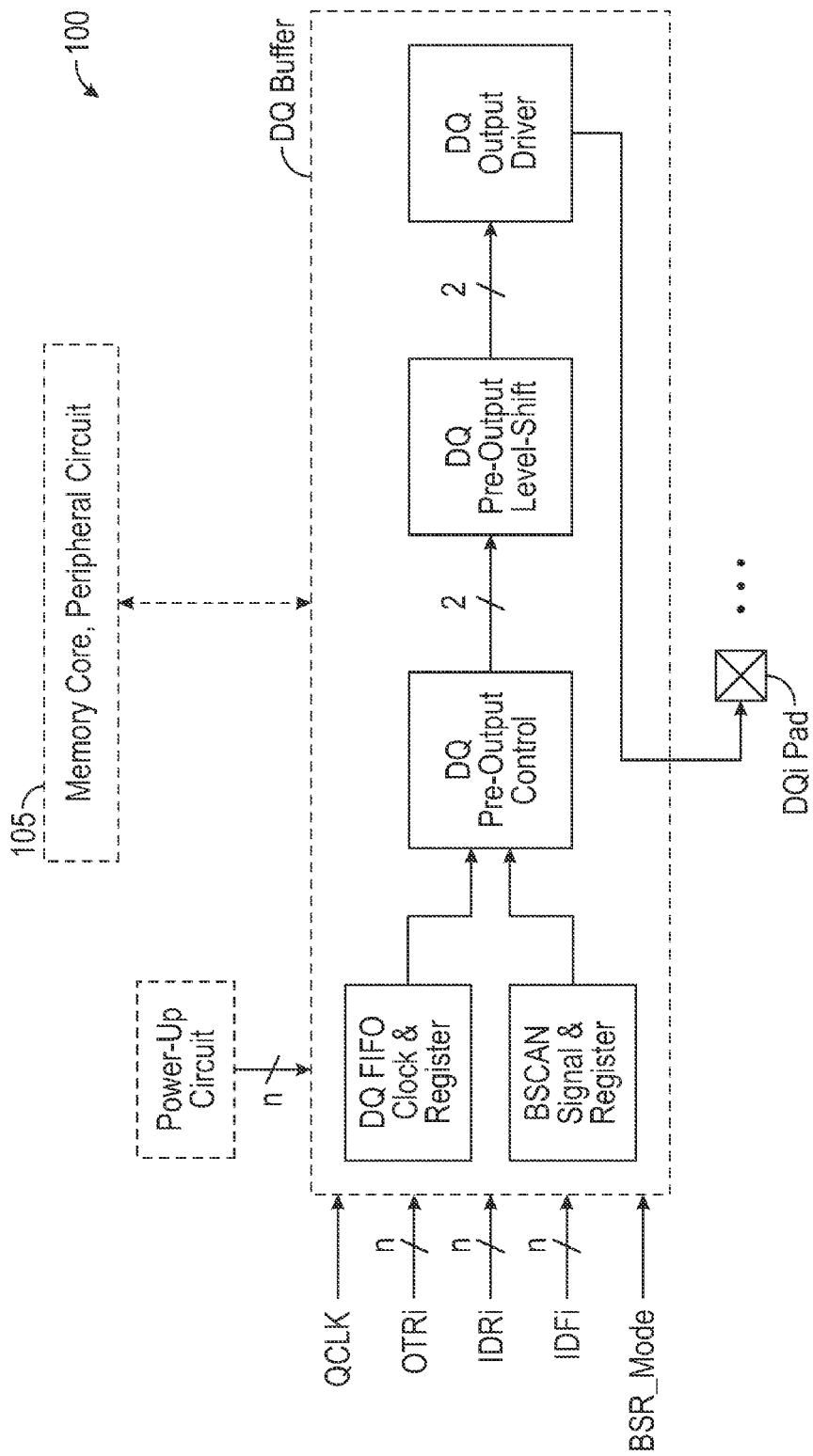
FIG. 1 is a diagram illustrating a known memory device.
Figure 2:
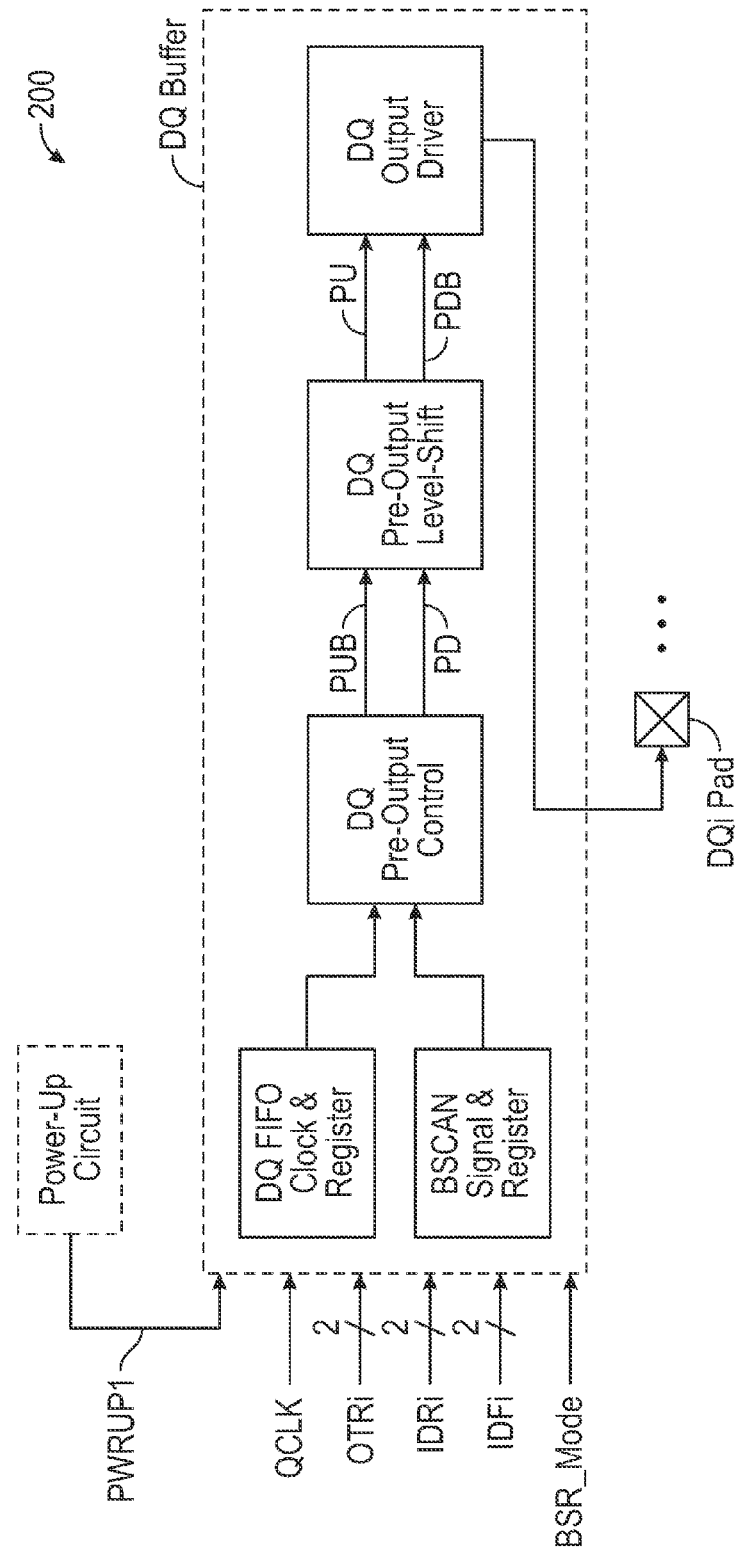
FIGS. 2 and 3 are illustrative output buffer circuitry and timing diagrams showing operational timing drawbacks consistent with an existing memory devices.
Figure 3:
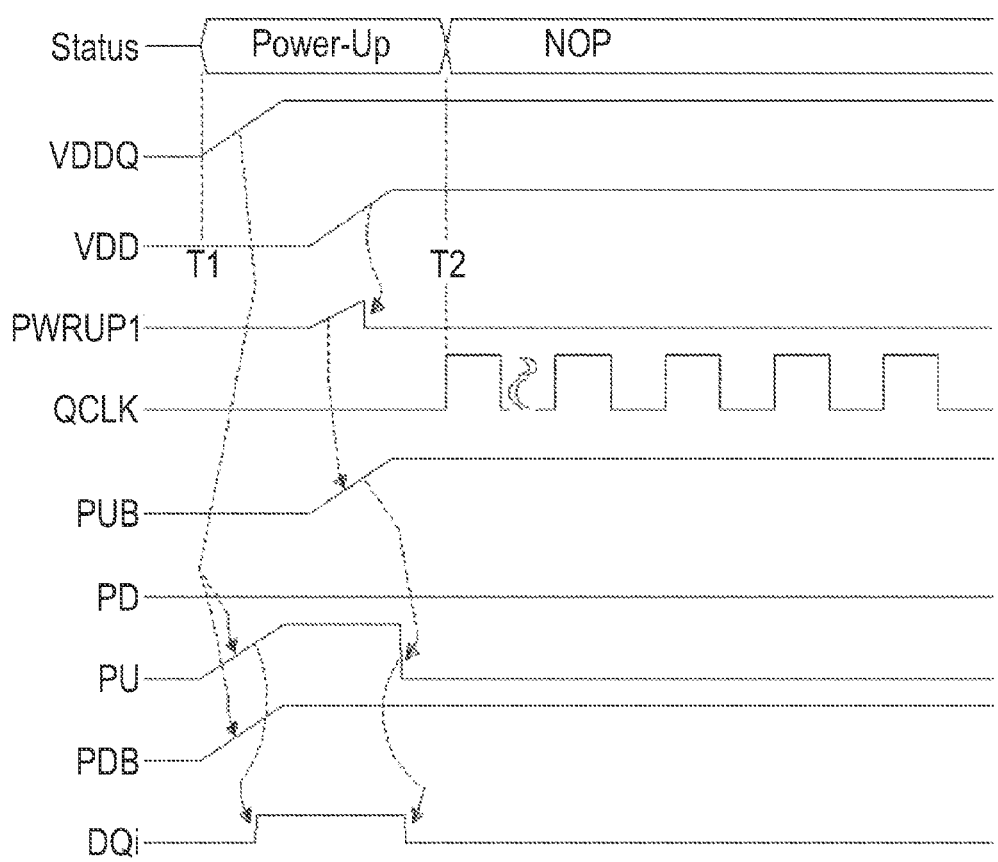
Figure 4:
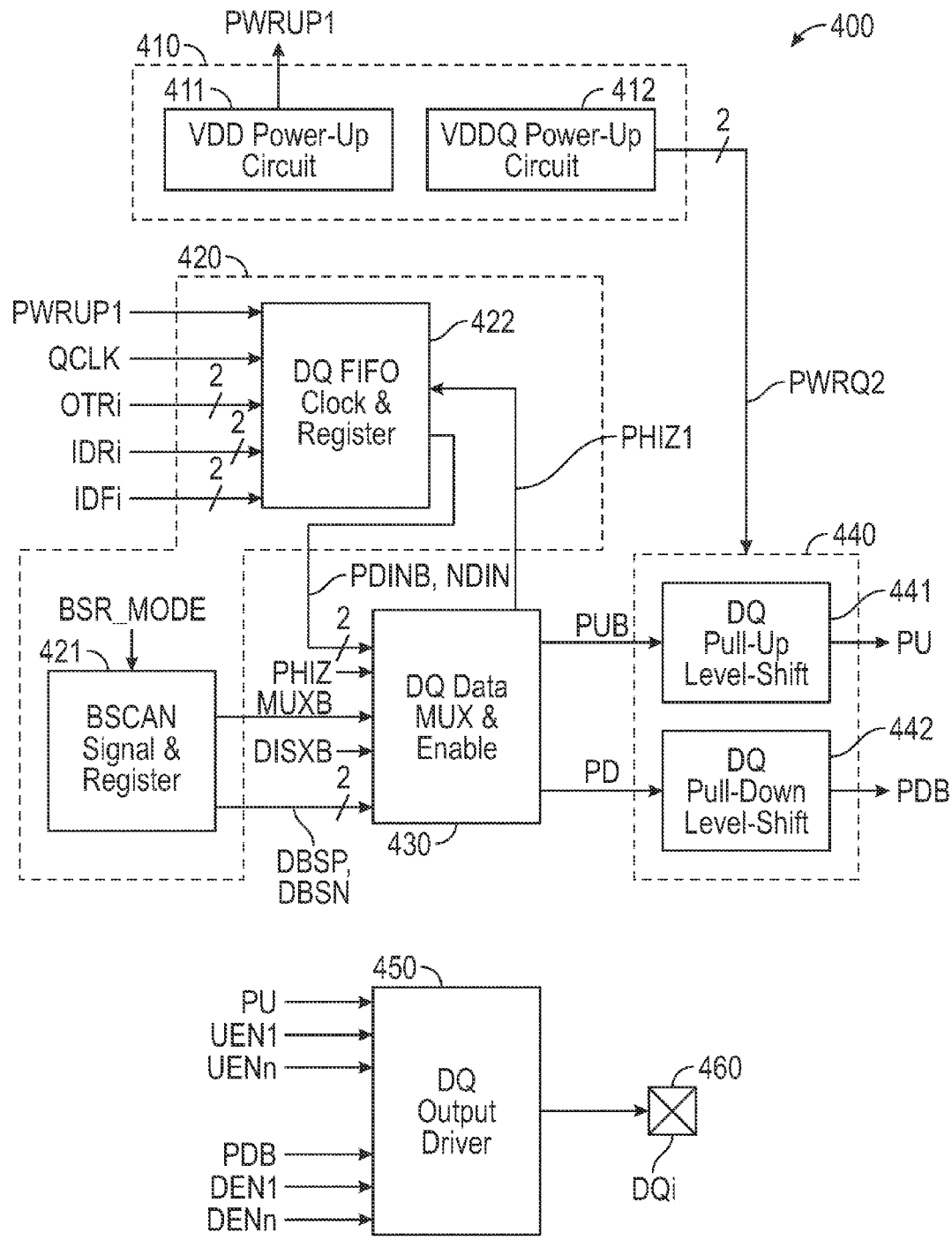
FIG. 4 is a diagram illustrating illustrative output buffer circuitry, consistent with one or more aspects related to the innovations herein.

FIG. 4 is a diagram illustrating illustrative output buffer circuitry, consistent with one or more aspects related to the innovations herein. Referring to FIG. 4, the illustrative DQ buffer scheme shown may comprise a first (VDD) power up circuit 411, a second (VDDQ) power-up circuit 412, a BSCAN signal and register circuit 421, a DQ FIFO clock and register circuit 422, a DQ data MUX & enable circuit 430, level-shifting circuitry 440 including a DQ pull-up level-shift circuit 441 and a DQ pull-down level shift circuit 442, and a DQ output driver circuit 450 leading to an output pad 460. Consistent with first aspects of the innovations herein, various configurations of such circuitry, such as features consistent with the second (VDDQ) power-up circuit 412 and the DQ pull-up/down level-shift circuitry 440, enable provision of DQ buffer output to be high-z state during disorderly or random power up and initialization sequences between power supplies. Further, according to some implementations, control signals associated with such output buffer circuitry may include free-running clock QCLK, FIFO clock OTRi, FIFO data IDRi & IDFi, and JTAG signal BSR_MODE (not shown).

As set forth in more detail in association with the circuits and circuitry below, aspect consistent with the present innovations may provide adaptive power up systems, and may include some pre- or self-initialized circuitry at the DQ pre-output stage of level-shifters, which hold appropriate levels whether the first or second power supplies ramp up in foreseen sequence or not. For example, innovations herein may include power up circuits of the DQ buffer enabling any ramping-up order of external power supply sequences, such as ramping up of second power supply VDDQ (the "VDDQ power") earlier than that of first power supply VDD (the "VDD power"), as is known to occur in high speed memories.

Various circuit configurations and schemes of operation may be involved with the innovative systems and methods herein. For example, at a high level, innovative circuits/operation/scheme aspects herein may include DQ pre-output level-shifting implemented before the DQ output driver connection receives the second power up detection signals, initializing output signals to high-z state signals, and/or providing eventual DQ output driver output control by previous high-z state signals, and such features may contribute to holding high-z states during random/disorderly power up sequences between VDD power and VDDQ power.

Indeed, as set forth in connection with the features having such DQ buffer schemes implemented below, systems and methods herein may keep DQ buffer output in high-z state at power-up and initialization under any ramping up power supply sequences. As such, innovations herein may improve DQ buffer operation and/or achieve better overall performance.

Figure 5:
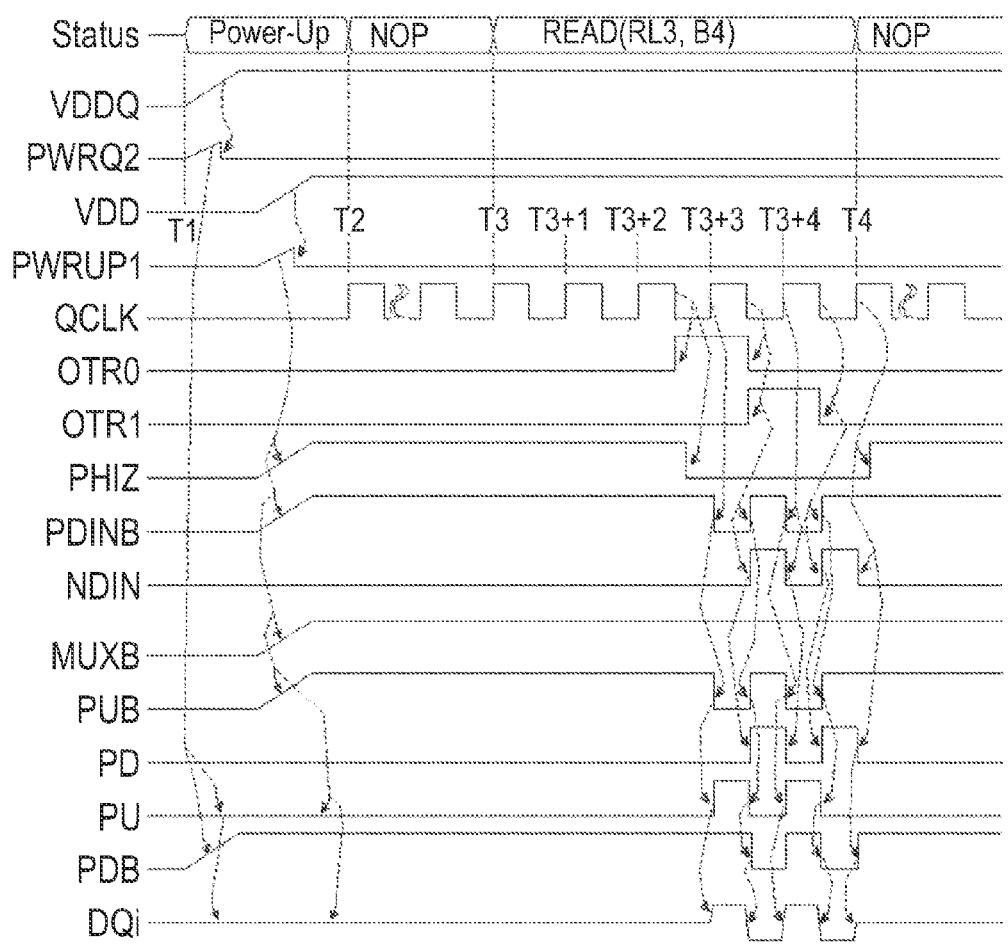
FIG. 5 is a diagram illustrating operational timing features such as may be associated with the circuitry of FIG. 4, consistent with one or more aspects related to the innovations herein.

FIG. 5 is a diagram showing illustrative operational timing features, such as may be associated with the circuitry of FIG. 4, consistent with one or more aspects related to the innovations herein. The operational timing diagram shown in FIG. 5 illustrates how operation of one illustrative system including how the VDDQ and VDDQ power-up circuit and DQ buffer initialization features is achieved, respectively. As shown in the timing diagram of FIG. 5, for example, if VDDQ power is ramped-up earlier than VDD power (T1 as compared to T2, i.e., in the POWER-UP range) desired operation and output at DQi may still be achieved. Specifically, a disable-state signal ("PU" at the low level, and "PDB" at the high level) at both of the DQ pre-output level-shift outputs, controlled by signal PWRQ2 (detected from the ramping up of second power VDDQ), enable the DQ buffer output to prevent any leak from VDDQ power to DQi pad. Additionally, if ramping up of first VDD power is early than that of second VDDQ power (i.e., normal operation) the circuitry performs without achieving any undesired states, as well.

Figure 6A:
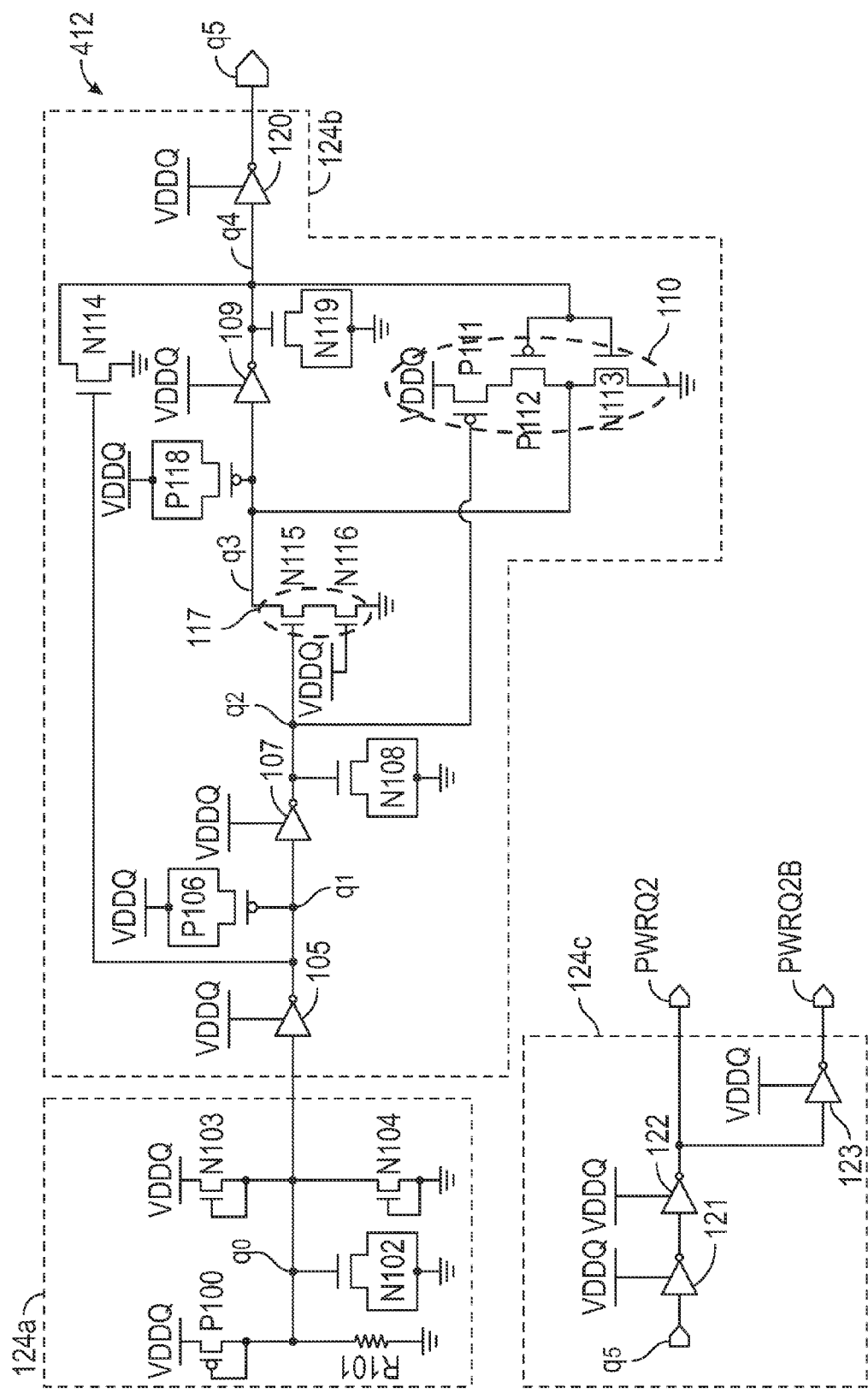
FIGS. 6A and 6B are diagrams illustrating illustrative second power up circuitry and associated timing information, consistent with one or more aspects related to the innovations herein.
Figure 6B:
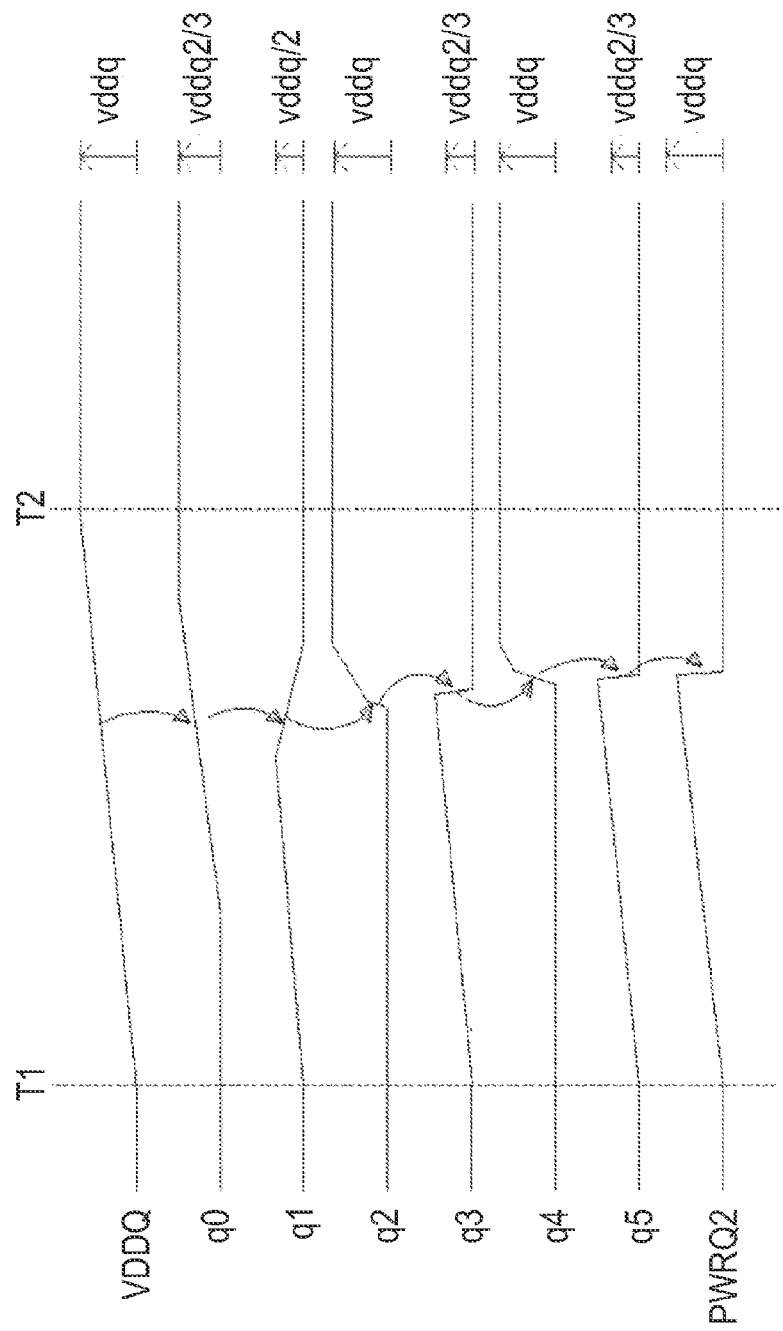

FIGS. 6A-6B are diagrams illustrating illustrative second power up circuitry (e.g. yielding PWRQ2 and PWRQ2B) and associated timing information, consistent with one or more aspects related to the innovations herein. Referring to these drawings, a schematic (FIG. 6A) and a timing diagram (FIG. 6B) of second (VDDQ) power-up circuitry 412 is shown. In some implementations, such circuitry may comprise a switched voltage divider 124a, a latched circuit 124b, and a driver circuit 124c. In an illustrative switched voltage divider circuit 124a, a NMOS N102 decoupling capacitor, an NMOS N103 power clamp, an NMOS N104 ground clamp, a PMOS P100 diode, and a resistor R101 may be arranged to tie to q0 signal and detect VDDQ power voltage level. Here, when VDDQ power starts to ramp up the signal q0 is at the low level until VDDQ voltage level reaches approximately the PMOS P100 switching voltage less than 1.0V, though when reaching about 1.0V this turns on the PMOS P100 diode such that the voltage at q0 is at the high level. The latched circuit 124b may then receive the signal q0 from the switched voltage divider 124a and latches via the inverter circuitry 109, 110, and its output signal q4 connects to the signal q5 through the inverter 120. The PMOS P106, NMOS N108, PMOS P118, and NMOS N119 serve to decouple the signals q1, q2, q3, and q4. Further, inverters 105 and 107 may be employed to amplify the signal q0 and establish connection to the signal q2. In some implementations, before reaching just below 1.0V of VDDQ voltage level, the NMOS N114, PMOS P111, and PMOS P112 that hold the signal q3 at a high level may be connected to the output signal q5 throughout the inverters 109 and 120 to provide power-up on. Further, transistor NMOS N114 may be configured with a gate coupled back to q1, providing bias enabling operation of the latched and power up circuitry herein. After reaching just over 1.0V of VDDQ voltage level, the NMOS N116 and N115 gate connected to the signal q2 and with the high level may provide power-up off. The inverters 121 to 123 serve as drivers for the signal q5, while the signal PWRQ2B is inverted from the signal PWRQ2.

Additionally, first power-up circuit 411 (e.g. for VDD) may also be configured to detect the first power VDD or internal VDC voltage level(s), in similar way to the above second power up circuit operation, and/or these power up circuits may also act as drivers for the DQ pre-output control circuit 420.

Figure 7A:
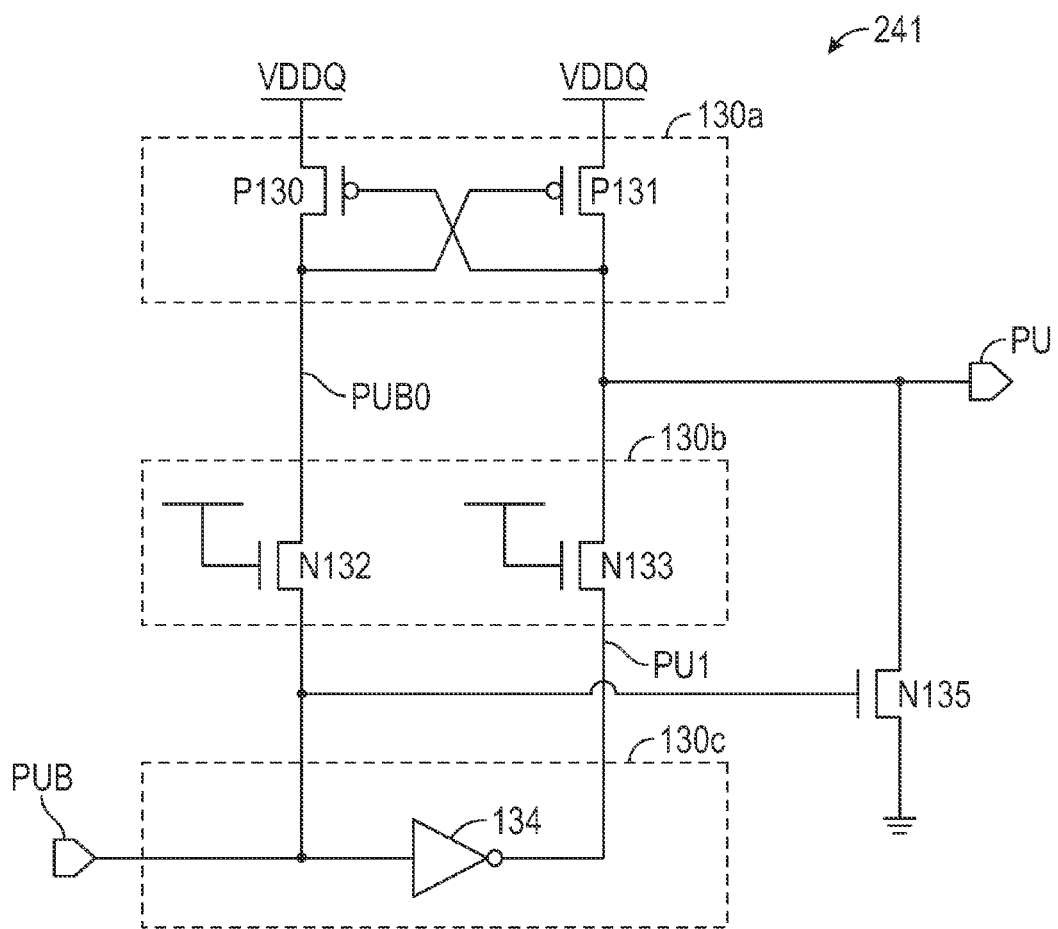
FIGS. 7A and 7B are circuit and timing diagrams illustrative of existing pull up circuitry.
Figure 7B:
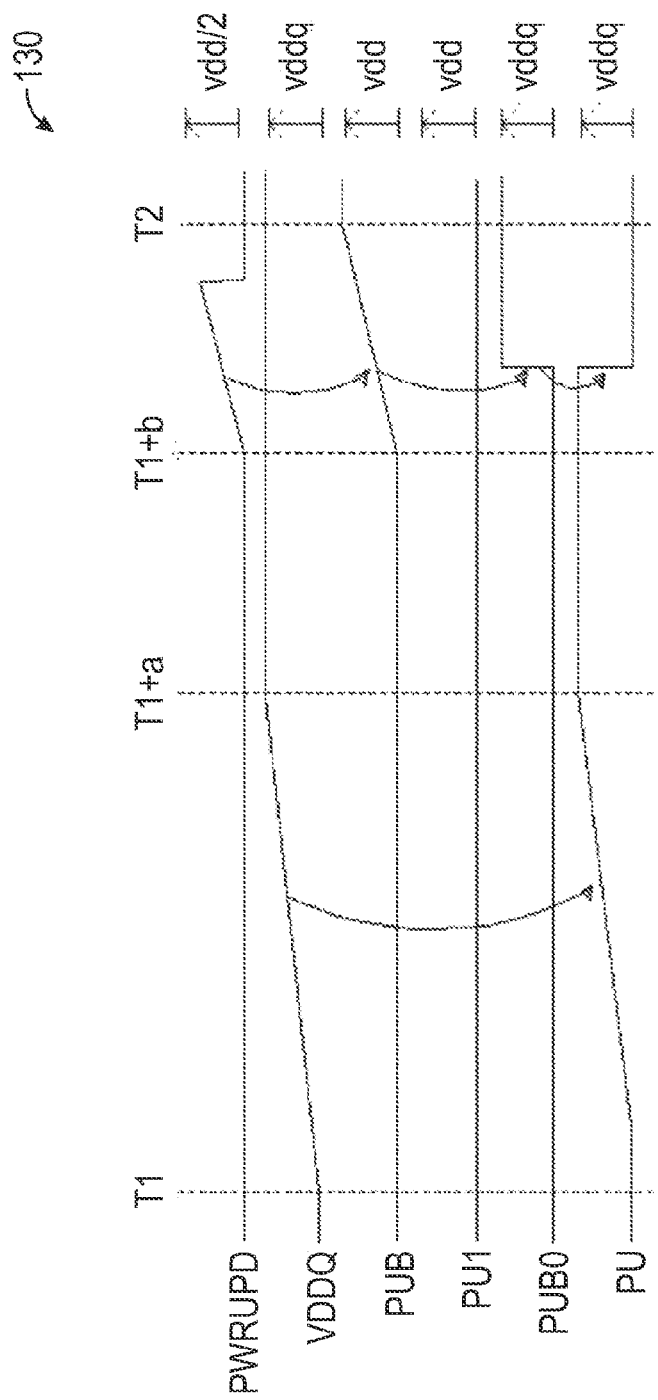

FIGS. 7A and 7B are circuit and timing diagrams illustrative of existing pull up circuitry. Referring to FIG. 7A, such existing DQ pull-up level-shift circuit 241 comprises a cross coupled transistor pair 130A, a protection transistor pair 130B, and an input section 130C. Here, if ramping up of second power VDDQ is earlier than that of first power VDD, one of the cross coupled pair 130A signals is lifted by the ramping up of VDDQ voltage to set to an enable-state of signal PU. This may occur until a high level state on the signal PUB controlled by signal PWRUPD coming from VDD power is achieved.

Figure 8A:
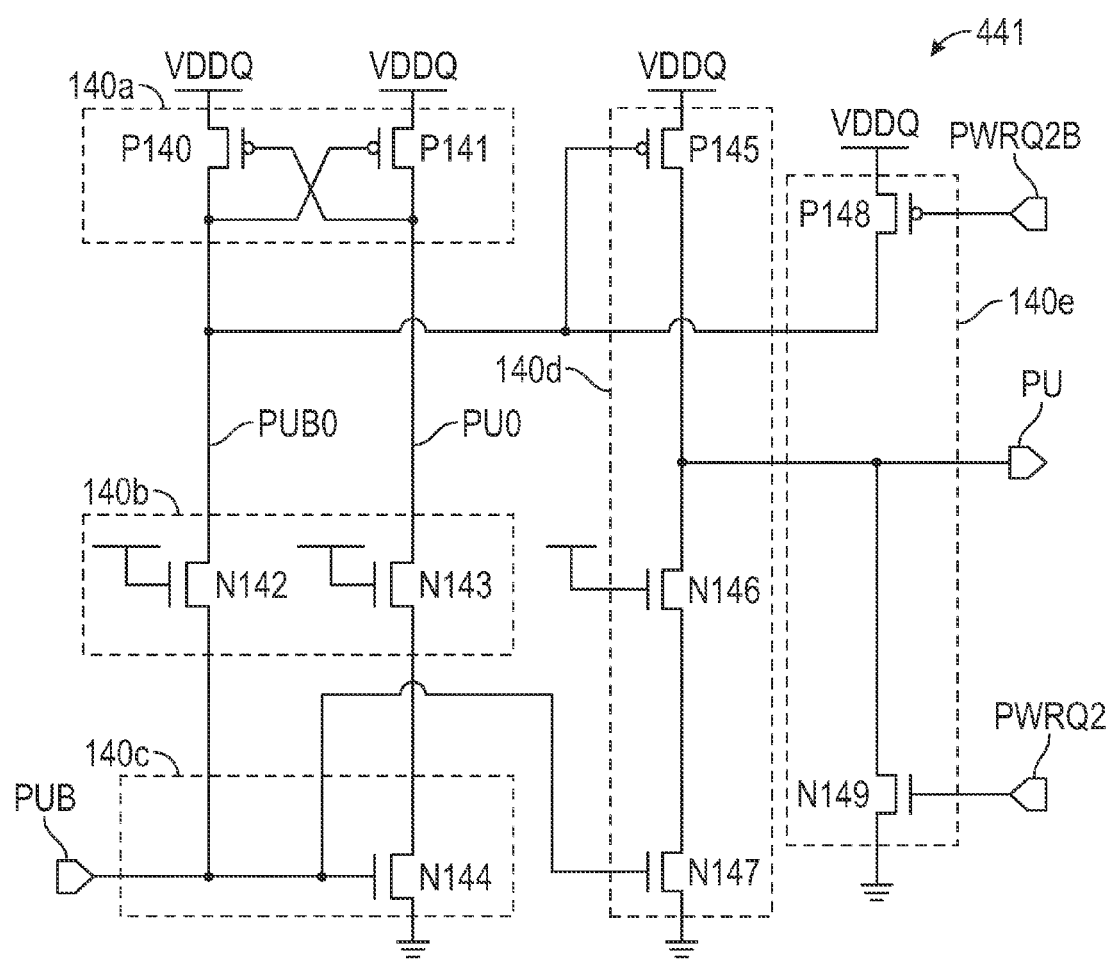
FIGS. 8A and 8B are circuit and timing diagrams illustrating features of pull up circuitry consistent with one or more aspects related to the innovations herein.
Figure 8B:
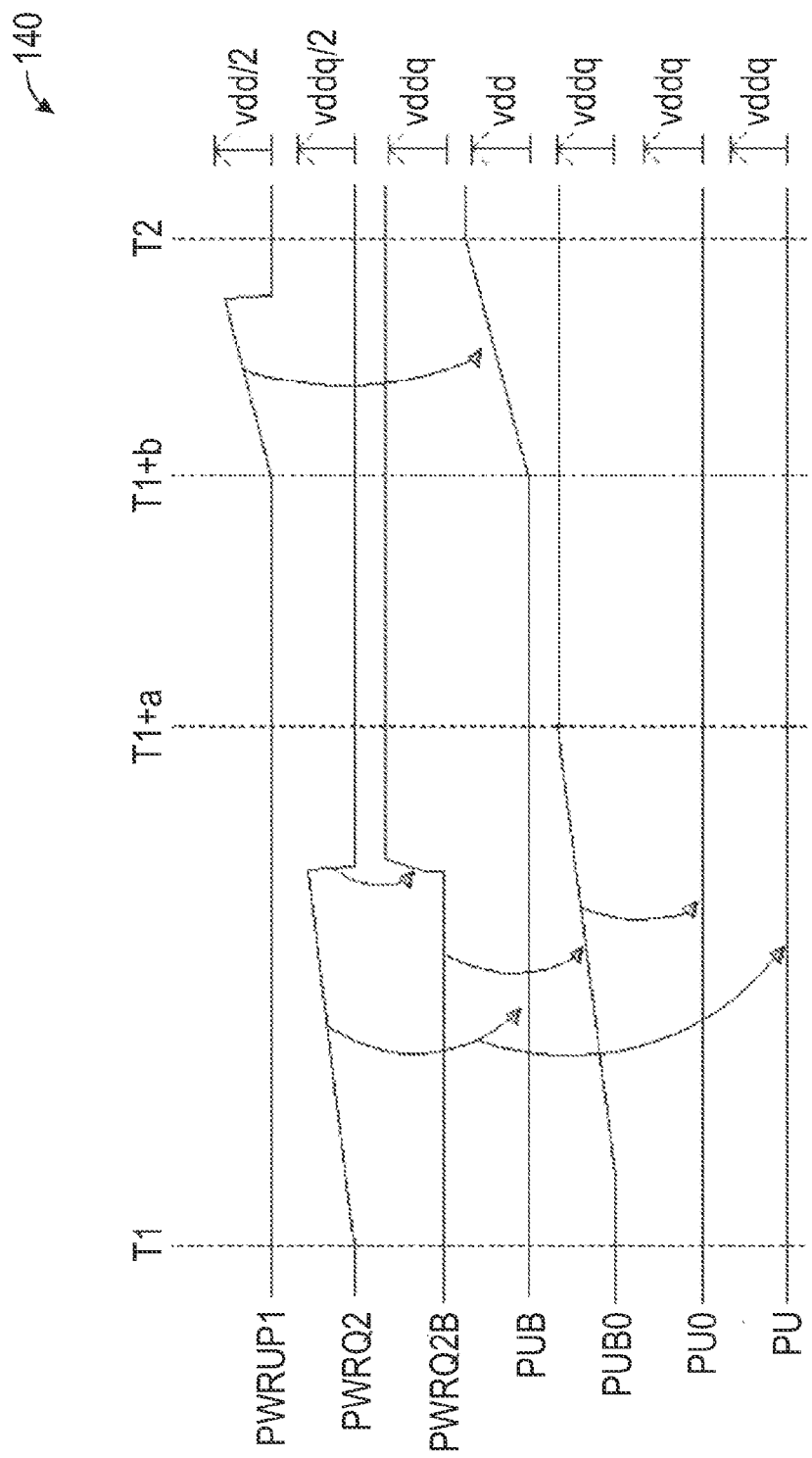

FIGS. 8A and 8B are circuit and timing diagrams illustrating features of pull up circuitry consistent with one or more aspects related to the innovations herein. Referring to FIG. 8A, an illustrative DQ pull-up level-shift circuit 441 may comprise a cross coupled pair 140A, a protection pair 140B, an input 140C, an output 140D, and an initialization circuit 140E. In operation, even though ramping up of second power supply VDDQ occurs prior to that of first VDD, one of the cross coupled 140A signals is lifted via ramping up of VDDQ voltage set to the high level-state of signal PUB0 initialized by PMOS transistor P148. PMOS transistor P148 has a gate controlled by the low level state of signal PWRQ2B, and the low level-state of signal PU0 is tied to the early high level-state of signal PUB0, such that the output, the PMOS P145, and the series-down NMOS N146/N147 (with gate tied to the low level-state of signal PUB) are turned off. Further, the output signal PU may be configured to only be initiated by the NMOS N149, which has a gate tied to the high level state of signal PWRQ2, to set the low level state and the pull-up disable state as shown in the timing diagram of FIG. 8B.

Figure 9A:
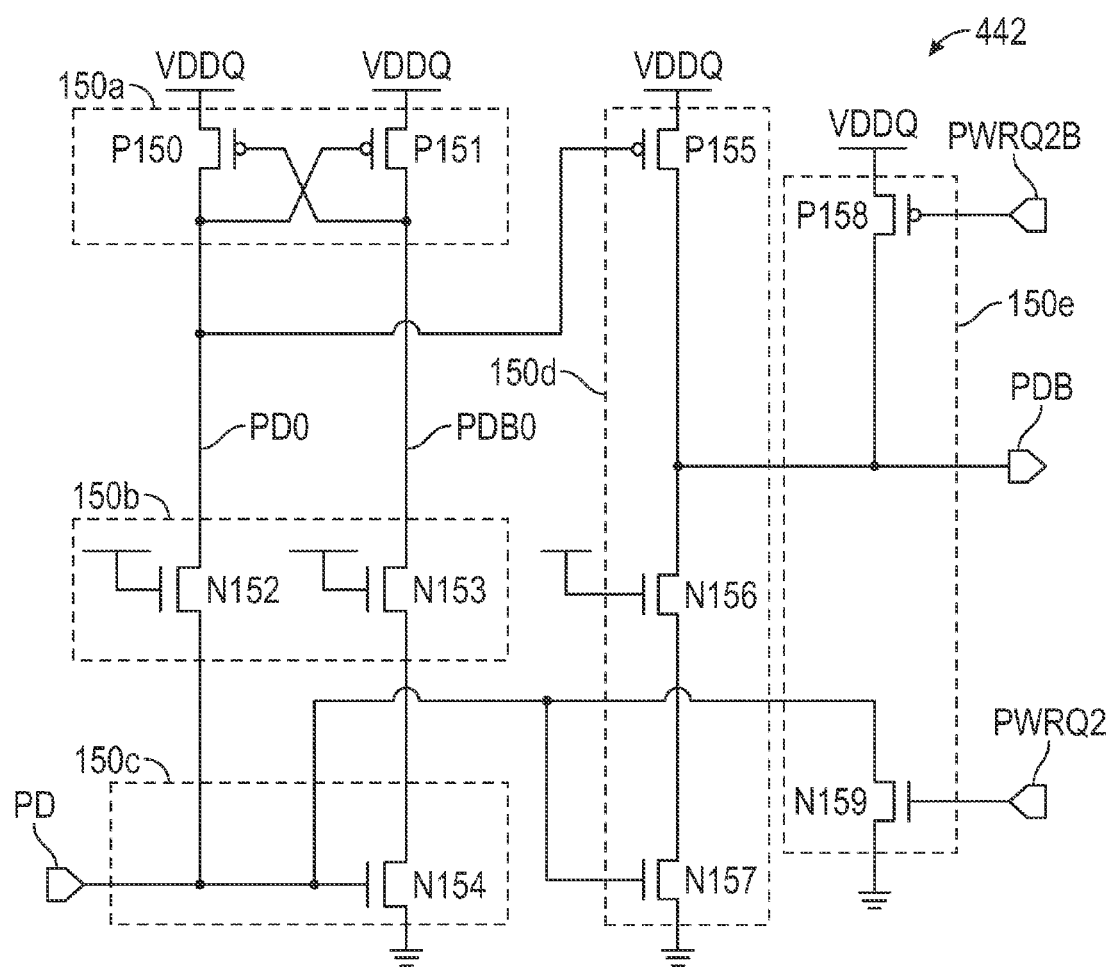
FIGS. 9A and 9B are circuit and timing diagrams illustrating features of pull down circuitry consistent with one or more aspects related to the innovations herein.
Figure 9B:
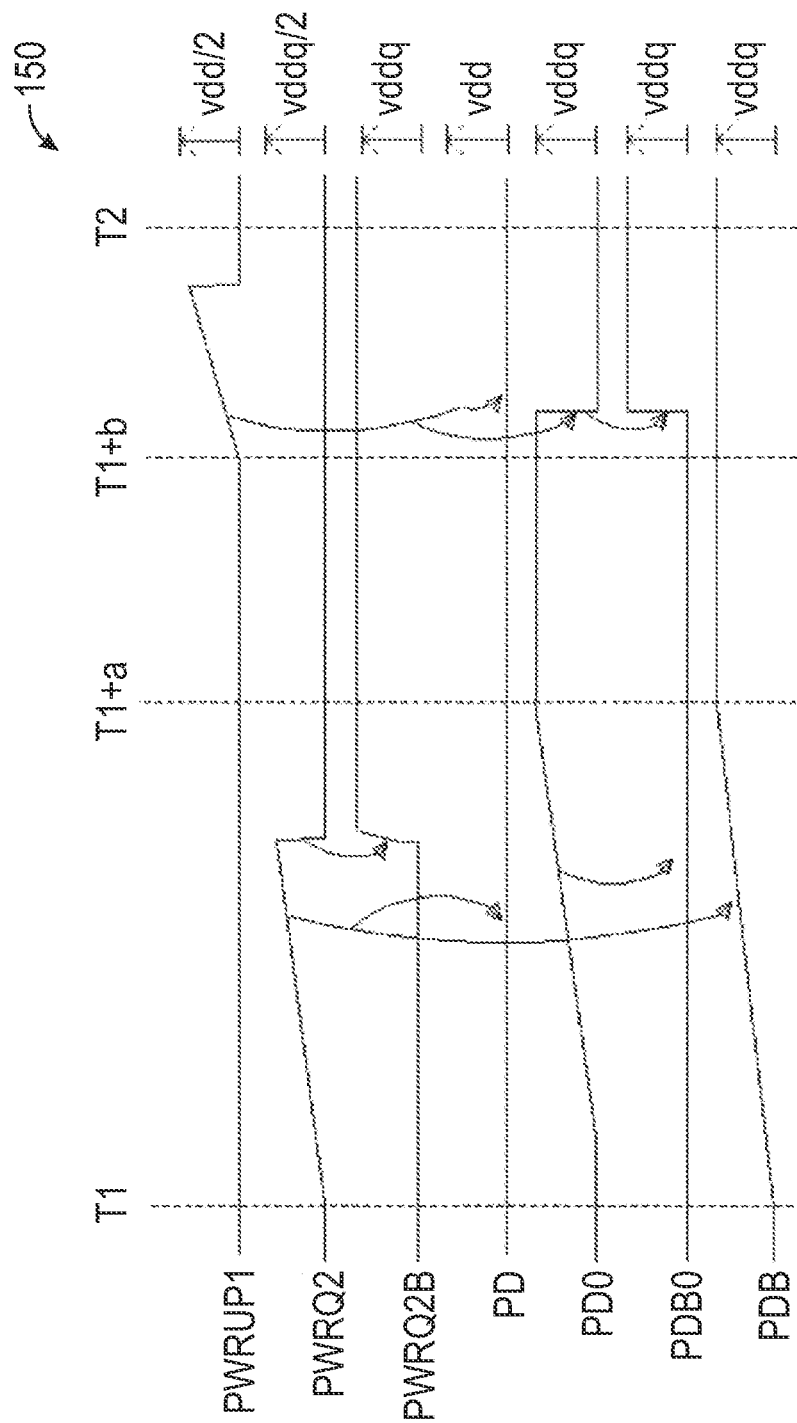

FIGS. 9A and 9B are circuit and timing diagrams illustrating features of pull down circuitry consistent with one or more aspects related to the innovations herein. Referring to FIG. 9A, a schematic diagram of an illustrative DQ pull-down level-shift circuit 442 is shown. Here, in some implementations, such circuit may be similar to the previous pull-up circuit except that the pre-charge circuitry is configured oppositely. For example, one illustrative implementation may comprises a cross coupled pair 150A, a protection pair 150B, an input circuit 150C, an output circuit 150D, and an initialization circuit 150E. As with the operation conditions discussed above, one of the cross coupled 150A signals may be lifted by the ramping up of VDDQ voltage set to the high level state of signal PD0, and the low level-state of signal PDB0 may be set by the early high level-state of signal PD0. Accordingly, the output circuitry, the PMOS P155 and the series-down NMOS N156/N157 (with gates tied to the low level-state of signal PD) may be initialized by the NMOS N159 (with gate tied to the high level-state of signal PWRQ2) and turned off. Further, then, the output signal PDB is only initiated by the PMOS P158 (with gate tied to the low level-state of signal PWRQ2B) being set to the high level state and having the pull-down disable state, e.g., as shown in the illustrative timing diagram of FIG. 9B.

Figure 10:
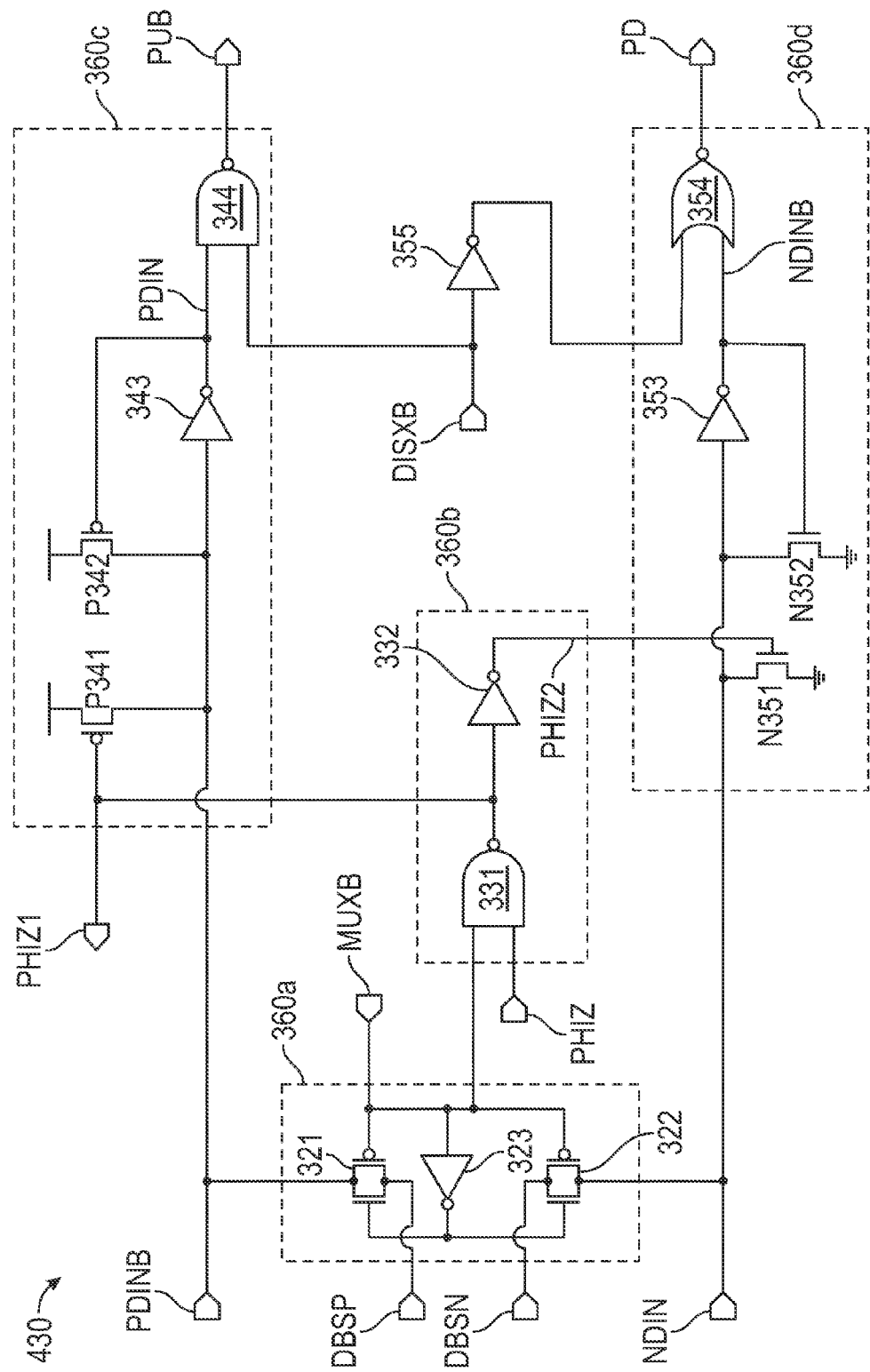
FIG. 10 is a diagram illustrating illustrative MUX and enable circuitry, consistent with one or more aspects related to the innovations herein.

FIG. 10 is a diagram illustrating illustrative MUX and enable circuitry, consistent with one or more aspects related to the innovations herein. Referring to FIG. 10, a schematic of DQ data MUX and enable 430 is shown. Further various waveforms set forth in FIG. 5 including DQ MUX 360A, DQ Enable 360B, DQ Pull-up Latch 360C, DQ Pull-down Latch 360D, and the inverter 355 controlled by signal DISXB (individual DQ disable signal fixed to the H level if selected) are also noted in FIG. 10. In some implementations, the signal MUXB of DQ MUX 360A may select one of DQ data registers in FIG. 4, according to the state of signal MUXB. Further, e.g. via a JTAG function operation mode, CMOS gates 321 and 322 may be turned on by the low level state of signal MUXB, which then transfers signals DBSP and DBSN (not shown) into DQ data path, though the gates may be otherwise set to the high level state.

In some implementations of operation, the signals PHIZ1 and PHIZ2 of DQ Enable 360B may be set to the high level of signal PDINB by turning on PMOS 341 of DQ pull-up latch 360C and the low level of signal NDIN by turning on DQ pull-down latch 360D, which may be controlled by the high level of signal PHIZ during POWER-UP period with ramping up of VDD power. The latch-back PMOS P342 and NMOS 352 may be configured to latch the previous high-z states of both data before a READ command during NOP cycles. Subsequently, when a Read command is issued, the input signals PDINB and NDIN receive read-out data throughout DQ FIFO clock and register (not shown) respectively. Then, according to some implementations, the inverter 343 & NAND gate 344 may produce DQ pull-up level-shift input signal PUB, and the inverter 353 & NOR gate 354 may generate DQ pull-down level-shift input signal PD. In the implementation illustrated in FIG. 4, FIFO clock and registers (shown within callout 420) are not described in detail, though in FIG. 5 a representative detail timing diagram is set forth. Here, some of its various operation control signal(s) from DQ Enable 360B, signal PHIZ1 to control POWER-UP, READ, and JTAG operation period are shown, respectively.

Figure 11:
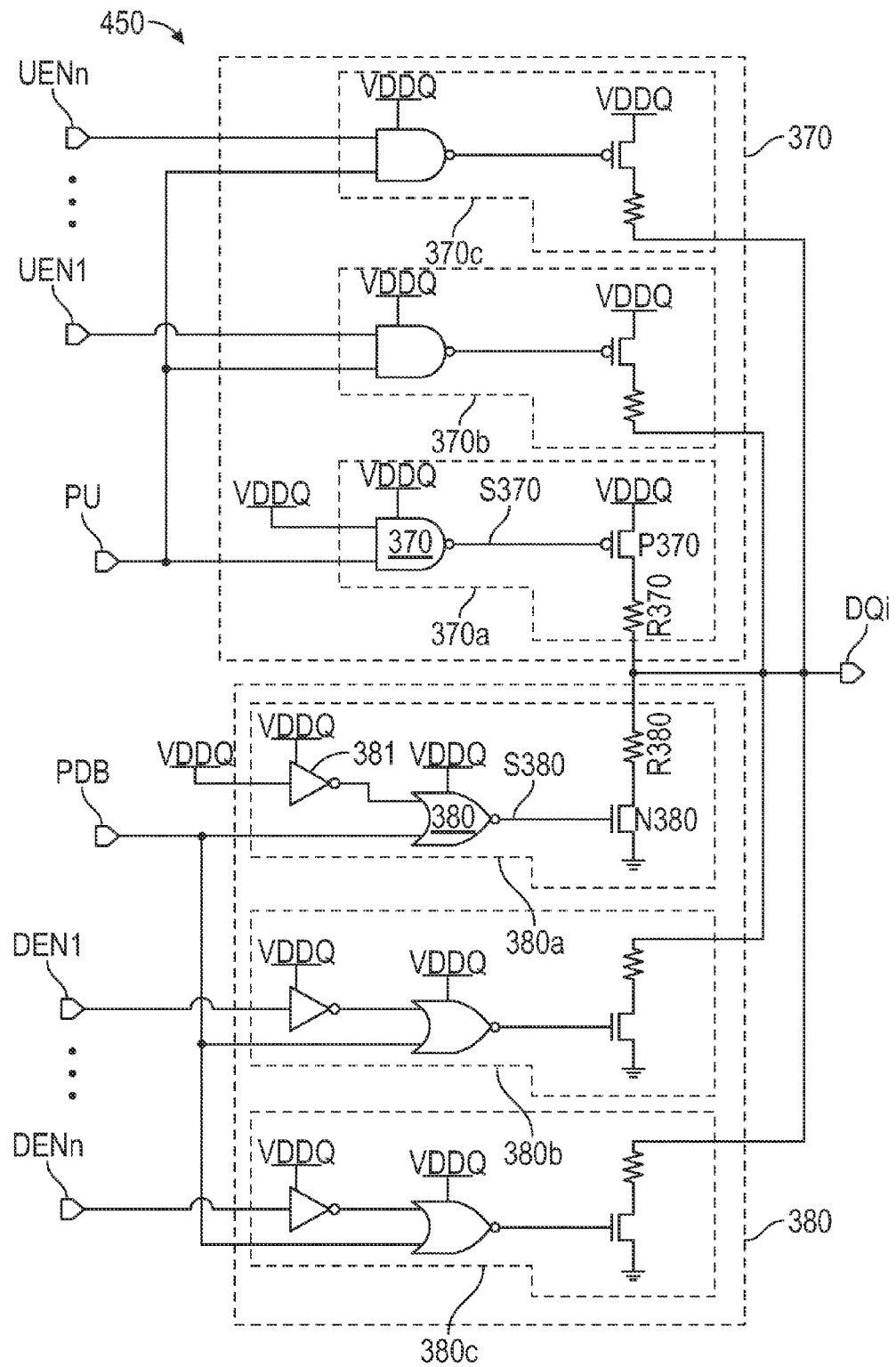
FIG. 11 is a diagram illustrating illustrative output driver circuitry, consistent with one or more aspects related to the innovations herein.

FIG. 11 is a diagram illustrating illustrative output driver circuitry, consistent with one or more aspects related to the innovations herein. Referring to FIG. 11, an illustrative schematic of DQ output driver circuit 450 is shown. FIG. 11 also illustrates some of the nodes corresponding to waveforms set forth in FIG. 5, e.g., in connection with the DQ pull-up output driver 370 and the DQ pull-down output driver 380. The "n" of the enable signals UENn and DENn may be set in accordance with the DQ output impedance control circuit at RLDRAM via a calibration method operation. Further, in some implementations, the pull-up driver 370A and the pull-down driver 380A may be controlled by the signals S370 and S380, which may be set to the enable level states after power-up and initialization. Other features and signals are also shown, including level states of DQ impedance control signals named as UEN1, UENn, DEN1 and DENn, and such aspects may operate according to the level of signals PU and PDB, as set to the various level states (on or off), e.g., via READ or JTAG command(s). Finally, signal DQi may be provided/connected to a pad, such as pad 460.

In embodiments herein, one or more output drivers may be associated with innovative implementations including one or more output buffers formed and such buffered set driver that includes or involves an individual DQ disable signal. Additionally, such driver circuitry may be configured as a function of organization, such as word length organization. As utilized herein, the term "organization" is used consistent with use by artisans in the field of RAM involving output buffer circuitry, e.g., output buffers formed on the same chip. Here, for example, as to switching signal(s) (e.g., DISB etc) that may be applied to at least one of the plurality of output buffers, the organization (e.g., word length organization, ×36, ×18, etc.) may be switched by the signal (e.g. DISB etc.) voltage level-states.

In certain implementations, switching signal(s), such as DISB, may be applied to at least one of the one or more output buffers to enable or disable the at least one output buffer. Further, such DISB switching signal(s) may be applied to the one or more output buffers to enable a first set/quantity of output buffers and/or to disable a second set of output buffers. Some implementations may be configured with a first buffered set driver that includes DQ output impedance control signals, such as UEN1/UENn and/or DEN1/DEN0. Implementations may also be configured, for example, with a second buffered set driver includes the DQ output impedance control signals, such as UEN1/UENn and/or DEN1/DEN0.

Additionally, the innovations herein may be achieved via implementations with differing or disparate components, i.e., beyond the specific circuits or circuitry set forth above. With regard to such other components (e.g., circuitry, computing/processing components, etc.) and/or computer-readable media associated with or embodying the present disclosure, for example, aspects of the innovations herein may be implemented consistent with numerous general or special purpose circuits, computing systems or configurations. Various exemplary circuits, computing systems, environments, and/or configurations that may be suitable for use with the innovations herein may include, but are not limited to, various power- or memory-related circuitry, such as that within personal computers, servers or server computing devices such as routing/connectivity components, hand-held or laptop devices, multiprocessor systems, microprocessor-based systems, set top boxes, smart phones, consumer electronic devices, network PCs, other existing computer platforms, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that perform particular tasks or implement particular control, delay or instructions. The inventions may also be practiced in the context of distributed circuit settings where circuitry is connected via communication buses, circuitry or links. In distributed settings, control/instructions may involve one or both local and remote computer storage media including memory storage devices.

Innovative circuitry and components herein may also include and/or utilize one or more type of computer readable media. Computer readable media can be any available media that is resident on, associable with, or can be accessed by such circuits and/or computing components. By way of example, and not limitation, such computer readable media may include or involve computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules or other data embodying the functionality herein. Further, communication media may include wired media such as a wired network or direct-wired connection, and wireless media such as acoustic, RF, infrared and other wireless media. Combinations of the any of the above are also included within the scope of computer readable media.

In the present description, the terms component, module, device, etc. may refer to any type of logical or functional circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive) to be read by a central processing unit to implement the functions of the innovations herein. Or, the modules can comprise programming instructions transmitted to a general purpose computer or to processing/graphics hardware. Also, the modules can be implemented as other hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the present inventions may be implemented through computer-hardware, software and/or firmware. For example, the systems and methods disclosed herein may be embodied in various forms including, for example, in association with memory of data processors, such as in computers that also include a database, digital electronic circuitry, firmware, software, or in combinations of them. Further, while some of the disclosed implementations describe components such as circuits, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various circuits, logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and other mechanisms that may be used to transfer such formatted data and/or instructions through wireless, optical, or wired signaling media or any combination thereof. Examples of transfers of such formatted data and/or instructions include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain implementations of the innovations herein have been specifically described herein, it will be apparent to those skilled in the art to which the inventions pertains that variations and modifications of the various implementations shown and described herein may be made without departing from the spirit and scope of the disclosure. Accordingly, it is intended that the inventions be limited only to the extent required by the appended claims and the applicable rules of law.

The invention claimed is:

1. A semiconductor device comprising:
    a memory cell array having a plurality of memory cells arranged in a matrix of rows and columns;
    power circuitry that provides power to the device upon power up, the power circuitry comprising a first power up circuit that outputs a first power up signal and a second power up circuit that outputs a second power-up signal; and
    an output buffer that outputs data from the memory cells or act output buffer pad sourced data selectively by a first control signal, wherein the output buffer includes level shifting circuitry comprising:

a pull-up level shift circuit comprising a first cross-coupled pair of transistors and first circuitry coupled to the second power up signal that provides a pull up output signal when the pull-up level shift circuit has not been powered by the first power-up signal; and a DQ pull-down level-shift circuit comprising a second cross-coupled pair of transistors and second circuitry coupled to the second power up signal that provides a pull down output signal when the pull-down level shift circuit has not been powered by the first power-up signal.

2. The device of claim 1 wherein the pull-up level shift circuit includes a first transistor coupled to VDDQ and configured, during a power up mode when other circuitry within the pull-up level shift circuit powered by the first power up circuit has not been powered, to initialize a first cross coupled output of a cross-coupled pair of transistors to high to avoid an initial high signal on a second cross couple output, providing a signal to turn off a second transistor associated with output circuitry and provide a pull up signal at an output node.

3. The device of claim 1 wherein the first circuitry includes a first PMOS transistor, having a first terminal connected to VDDQ, a gate connected to the second power up signal's complement signal, and a second terminal connected to an earlier node to initialize a high level state of a signal associated with the level shift circuitry, a second PMOS transistor and two NMOS transistors in series, and/or an NMOS transistor.

4. The device of claim 1 wherein the DQ pull-down level shift circuit includes a first transistor coupled to ground and configured, during a power up mode when other circuitry within the pull-down level shift circuit powered by the first power up circuit has not been powered, to initialize a first cross coupled output of a cross-coupled pair of transistors to high to avoid an initial high signal on a second cross couple output, providing a signal to turn off a second transistor and provide a pull down signal at an output node.

5. The device of claim 1 wherein the second circuitry includes a first PMOS transistor with first terminal connected to VDDQ, gate connected to the second power up signal's complement signal, and second terminal connected to the output PDB, a second PMOS transistor with first terminal connected to VDDQ, second terminal connected to the output PDB, and gate connected to an earlier node of the second cross-coupled pair, two NMOS transistors in series with the second PMOS transistor with a terminal of the first NMOS transistor coupled to the output PDB, and another NMOS transistor with first terminal connected to a node of the second cross-coupled pair, second terminal connected to ground, and a gate coupled to the second power up signal.

6. The device of claim 1 wherein the first circuitry and/or the second circuitry include one or more transistors coupled to the second power-up signal and/or the second power-up signal's complement signal.

7. The device of claim 6 wherein the first power up circuit operates on a first supply voltage and the second power up circuit operates on a second supply voltage.

8. The device of claim 6 wherein the second power up circuitry comprises a switched voltage divider circuit, a latch circuit, and a driver circuit.

9. The device of claim 6 wherein the second power up circuitry comprises a latch circuit including a precharge coupling that provides power enable until transition to a power discharge state.

10. The device of claim 6 wherein the second power up circuit includes a divider circuit, a latching circuit, and a driver circuit.

11. The device of claim 6 wherein the second power up circuit includes means for latching an input/signal to a driver circuit.

12. The device of claim 6 wherein the first power up circuit operates on a first external voltage of power supply or on an internal voltage of power supply.

13. The device of claim 6 wherein the second power up circuit operates on a second external voltage of power supply.

14. The device of claim 6 further comprising one or more output buffers and a first buffered set driver including an individual disable signal, wherein the first buffered set driver is configured as a function of an output buffer organization feature.

15. The device of claim 1 wherein the first power up circuit operates on a first supply voltage and the second power up circuit operates on a second supply voltage.

16. The device of claim 1 wherein the second power up circuitry comprises a switched voltage divider circuit, a latch circuit, and a driver circuit.

17. The device of claim 1 or claim 16 wherein the second power up circuitry comprises a latch circuit including a precharge coupling that provides power enable until transition to a power discharge state.

18. The device of claim 1 wherein the second power up circuit includes a divider circuit, a latching circuit, and a driver circuit.

19. The device of claim 1 wherein the second power up circuit includes means for latching an input/signal to a driver circuit.

20. The device of claim 1, wherein the first power up circuit operates on a first external voltage of power supply or on an internal voltage of power supply.

21. The device of claim 1, wherein the second power up circuit operates on a second external voltage of power supply.

22. The device of claim 1 further comprising one or more output buffers and a first buffered set driver including an individual disable signal, wherein the first buffered set driver is configured as a function of an output buffer organization feature.

23. The device of claim 22, wherein a switching signal is applied to at least one of the one or more output buffers to enable or disable the at least one output buffer.

24. The device of claim 22, wherein a DISB switching signal is applied to the one or more output buffers to enable a first set or quantity of output buffers and/or to disable a second set of output buffers.

25. The device of claim 22, wherein the first buffered set driver includes DQ output impedance control signals.

26. The device of claim 25, wherein a second buffered set driver includes the DQ output impedance control signals.

27. The device of claim 1 further comprising a peripheral circuit configured to read out data from the memory cell.

28. The device of claim 27 wherein the first circuitry and/or the second circuitry include one or more transistors coupled to the second power-up signal and/or the second power-up signal's complement signal.

29. The device of claim 27 wherein the first power up circuit operates on a first supply voltage and the second power up circuit operates on a second supply voltage.

30. The device of claim 27 wherein the second power up circuitry comprises a switched voltage divider circuit, a latch circuit, and a driver circuit.

31. The device of claim 27 wherein the second power up circuitry comprises a latch circuit including a precharge coupling that provides power enable until transition to a power discharge state.

32. The device of claim 27 wherein the second power up circuit includes a divider circuit, a latching circuit, and a driver circuit.

33. The device of claim 27 wherein the second power up circuit includes means for latching an input/signal to a driver circuit.

34. The device of claim 27 wherein the first power up circuit operates on a first external voltage of power supply or on an internal voltage of power supply.

35. The device of claim 27 wherein the second power up circuit operates on a second external voltage of power supply.

36. The device of claim 27 further comprising one or more output buffers and a first buffered set driver including an individual disable signal, wherein the first buffered set driver is configured as a function of an output buffer organization feature.

37. A semiconductor device comprising:
a memory cell array having a plurality of memory cells arranged in a matrix of rows and columns;
power circuitry that provides power to the device upon power up, the power circuitry comprising a first power up circuit that outputs a first power-up signal and a second power up circuit that outputs a second power-up signal, wherein the second power up circuitry comprises a latch circuit including a precharge coupling that provides power enable until transition to a power discharge state; and
an output buffer that outputs data from the memory cells or output buffer pad sourced data selectively by a first control signal, wherein the output buffer includes level shifting circuitry comprising:
a pull-up level shift circuit comprising a first cross-coupled pair of transistors and first circuitry coupled to the second power up signal that provides a pull up output signal when the pull-up level shift circuit has not been powered by the first power-up signal; and
a pull-down level-shift circuit comprising a second cross-coupled pair of transistors and second circuitry coupled to the second power up signal that provides a pull down output signal when the pull-down level shift circuit has not been powered by the first power-up signal.

38. The device of claim 37, wherein the output buffer comprises:
a first group register that receives the memory cell data, the first group register generating a first set output data base on a first clock signal, a first data signal, a first enable sourced signal, and said first circuit output;
a second group register that receives the output buffer pad sourced data and generates a second set output data base on a second clock signal, and second data signal;
a data determination circuit having an input set signal receiving and selecting either the first set output data or the second set output data in response to the first control sourced signal, and wherein a first enabled signal is coupled to the data determination circuit to produce a first set pre-output through a first buffered set driver.

39. The device of claim 37 further comprising:
a first data level-shift set circuit which operates on the second voltage of power supply, and outputs a second set pre-output base on the first set pre-output after finishing said second voltage of power supply initialization operation; and
an output driver set circuit receiving the second set pre-output produces a pad driven signal via a second buffered set driver.

40. The device of claim 37 further comprising a peripheral circuit configured to read out data from the memory cell.

41. The device of claim 37, wherein the first power up circuit operates on a first external voltage of power supply or on an internal voltage of power supply.

42. The device of claim 37, wherein the second power up circuit operates on a second external voltage of power supply.

43. The device of claim 37 further comprising one or more output buffers and a first buffered set driver including an individual DQ disable signal, wherein the first buffered set driver is configured as a function of an output buffer organization feature.

44. The device of claim 43, wherein a switching signal is applied to at least one of the one or more output buffers to enable or disable the at least one output buffer.

45. The device of claim 43, wherein a DISB switching signal is applied to the one or more output buffers to enable a first set or quantity of output buffers and/or to disable a second set of output buffers.

46. The device of claim 43, wherein the first buffered set driver includes DQ output impedance control signals.

47. The device of claim 46, wherein a second buffered set driver includes the DQ output impedance control signals.

* * * * *